(12) United States Patent
Caraccio et al.

(10) Patent No.: US 10,776,031 B2
(45) Date of Patent: *Sep. 15, 2020

(54) MULTI-PARTITIONING OF MEMORIES

(71) Applicant: Micron Technology, Inc., Boise, ID (US)

(72) Inventors: Danilo Caraccio, Milan (IT); Emanuele Confalonieri, Lesmo (IT); Federico Tiziani, Munich (DE)

(73) Assignee: Micron Technology, Inc., Boise, ID (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/201,729

(22) Filed: Nov. 27, 2018

(65) Prior Publication Data

US 2019/0171385 A1 Jun. 6, 2019

Related U.S. Application Data

(63) Continuation of application No. 15/685,926, filed on Aug. 24, 2017, now Pat. No. 10,162,556, which is a (Continued)

(51) Int. Cl.
*G06F 3/06* (2006.01)
*G06F 12/02* (2006.01)
(Continued)

(52) U.S. Cl.
CPC .......... *G06F 3/0644* (2013.01); *G06F 3/0607* (2013.01); *G06F 3/0608* (2013.01); *G06F 3/0631* (2013.01); *G06F 3/0637* (2013.01); *G06F 3/0685* (2013.01); *G06F 9/5077* (2013.01); *G06F 12/0223* (2013.01); (Continued)

(58) Field of Classification Search
CPC .... G06F 3/0644; G06F 3/0607; G06F 3/0608; G06F 3/0631; G06F 3/0637; G06F 3/0685
See application file for complete search history.

(56) References Cited

U.S. PATENT DOCUMENTS 7,106,636 B2 9/2006 Eilert et al.
7,768,828 B2 8/2010 Lee et al.
(Continued)

OTHER PUBLICATIONS

"Embedded MultiMediaCard (eMMC) eMMC/Card Product Standard, High Capacity, including reliable write, boot, sleep odes, dual data rate", JEDEC, multiple partition supports and security enhancement, [Online]. Retrieved from Internet http://www.jedec.org, (Mar. 2009).

(Continued)

*Primary Examiner* — Ryan Bertram
(74) *Attorney, Agent, or Firm* — Schwegman Lundberg & Woessner, P.A.

(57) ABSTRACT

Various embodiments comprise apparatuses and methods including a method of reconfiguring partitions in a memory device as directed by a host. The method includes managing commands through a first interface controller to mapped portions of a first memory not having an attribute enhanced set, and mapping portions of a second memory having the attribute enhanced set through a second interface controller. Additional apparatuses and methods are described.

21 Claims, 4 Drawing Sheets

Related U.S. Application Data continuation of application No. 14/954,507, filed on Nov. 30, 2015, now Pat. No. 9,778,875, which is a continuation of application No. 14/247,783, filed on Apr. 8, 2014, now Pat. No. 9,201,705, which is a continuation of application No. 13/620,980, filed on Sep. 15, 2012, now Pat. No. 8,706,957, which is a continuation of application No. 12/628,152, filed on Nov. 30, 2009, now Pat. No. 8,307,151.

(51) Int. Cl.
| | | |
|---|---|---|
| *G06F 13/38* | (2006.01) | |
| *G06F 9/50* | (2006.01) | |
| *G11C 14/00* | (2006.01) | |
| *G11C 13/00* | (2006.01) | |

(52) U.S. Cl.
CPC ...... *G06F 12/0238* (2013.01); *G06F 12/0246* (2013.01); *G06F 13/385* (2013.01); *G11C 14/009* (2013.01); *G06F 2212/2022* (2013.01); *G06F 2212/2024* (2013.01); *G06F 2213/3804* (2013.01); *G06F 2213/3854* (2013.01); *G11C 13/0002* (2013.01); *G11C 13/0004* (2013.01); *Y02D 10/13* (2018.01); *Y02D 10/14* (2018.01); *Y02D 10/151* (2018.01)

(56) References Cited

U.S. PATENT DOCUMENTS

| | | |
|---|---|---|
| 8,307,151 B1 | 11/2012 | Caraccio et al. |
| 8,397,013 B1 | 3/2013 | Rosenband et al. |
| 8,706,957 B2 | 4/2014 | Caraccio et al. |
| 9,201,705 B2 | 12/2015 | Caraccio et al. |
| 9,778,875 B2 | 10/2017 | Caraccio |
| 2006/0072369 A1 | 4/2006 | Madter et al. |
| 2007/0055823 A1* | 3/2007 | Jo ............ G06F 13/387 711/115 |
| 2007/0174516 A1 | 7/2007 | Wang |
| 2008/0009317 A1 | 1/2008 | Lasser et al. |
| 2008/0046638 A1 | 2/2008 | Maheshwari et al. |
| 2008/0104304 A1 | 5/2008 | Shin |
| 2009/0089500 A1 | 4/2009 | Jiang |
| 2009/0094678 A1 | 4/2009 | Floman et al. |
| 2009/0150597 A1 | 6/2009 | Yang et al. |
| 2009/0193184 A1 | 7/2009 | Yu et al. |
| 2009/0198877 A1 | 8/2009 | Pua et al. |
| 2009/0222639 A1 | 9/2009 | Hyvonen et al. |
| 2010/0023682 A1 | 1/2010 | Lee et al. |
| 2010/0218064 A1 | 8/2010 | Ito |
| 2010/0257313 A1 | 10/2010 | Nishizawa et al. |
| 2010/0262759 A1* | 10/2010 | Borchers ............ G06F 3/0644 711/103 |
| 2010/0293317 A1 | 11/2010 | Confalonieri et al. |
| 2010/0318724 A1* | 12/2010 | Yeh ............... G06F 12/0246 711/103 |
| 2011/0145477 A1 | 6/2011 | Rudelic |
| 2013/0019058 A1 | 1/2013 | Caraccio et al. |
| 2014/0223087 A1 | 8/2014 | Caraccio et al. |
| 2016/0085476 A1 | 3/2016 | Caraccio et al. |
| 2017/0351458 A1 | 12/2017 | Caraccio et al. |

OTHER PUBLICATIONS

"Embedded MultiMediCard (eMMC) eMMC/Card Product Standard, High Capacity, including Reliable Write, Boot, and Sleep Modes (MMCA, 4.3)", JEDEC Solid State Technology Association, (Nov. 2007), 168 pgs.

\* cited by examiner

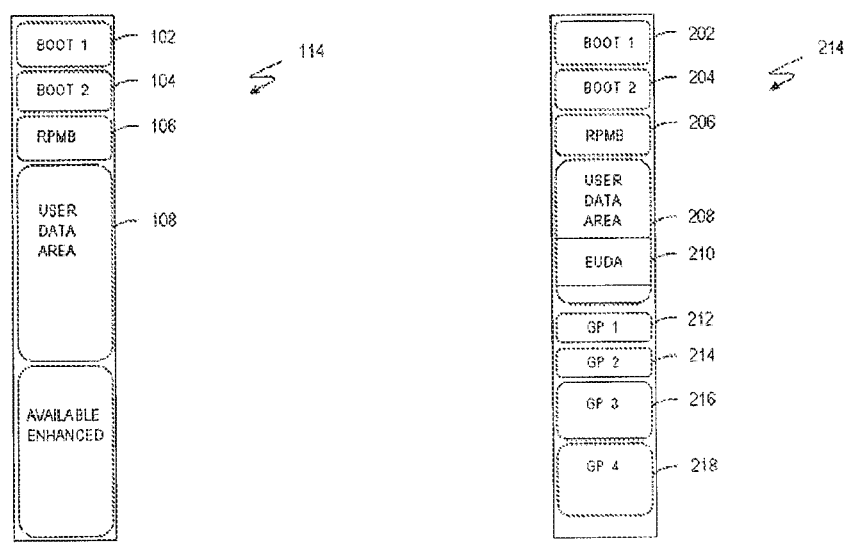

MULTI-PARTITIONING OF MEMORIES

PRIORITY APPLICATION

This application is a continuation of U.S. application Ser. No. 15/685,926, now issued as U.S. Pat. No. 10,162,556, which is a continuation of U.S. application Ser. No. 14/954,507, filed Nov. 30, 2015, now issued as U.S. Pat. No. 9,778,875, which is a continuation of U.S. application Ser. No. 14/247,783, filed Apr. 8, 2014, now issued as U.S. Pat. No. 9,201,705, which is a continuation of U.S. application Ser. No. 13/620,980, filed Sep. 15, 2012, issued as U.S. Pat. No. 8,706,957, which is a continuation of U.S. application Ser. No. 12/628,152, filed Nov. 30, 2009, now issued as U.S. Pat. No. 8,307,151, all of which are incorporated herein by reference in their entirety.

BACKGROUND OF THE INVENTION

The requirements of increasing functionality, shrinking physical size and reducing overall system cost can place system constraints on consumer electronics devices. Flash memory has been used to make storage portable among consumer devices such as car navigation systems, smart phones, digital cameras, PDAs, and MP3 players, and countless other portable applications. New non-volatile technologies that supplement flash memory are being planned for an increasing number of functions in digital consumer devices. These new non-volatile memories provide "managed memory" capabilities that allow system designers to re-evaluate the memory subsystems and look for improvements in these devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 1 and 2 illustrate an organization of the addressable space in the memory areas of a memory combination, with FIG. 1 showing the organization before partitioning and FIG. 2 showing the organization after partitioning in accordance with the present invention;

Figure 3:
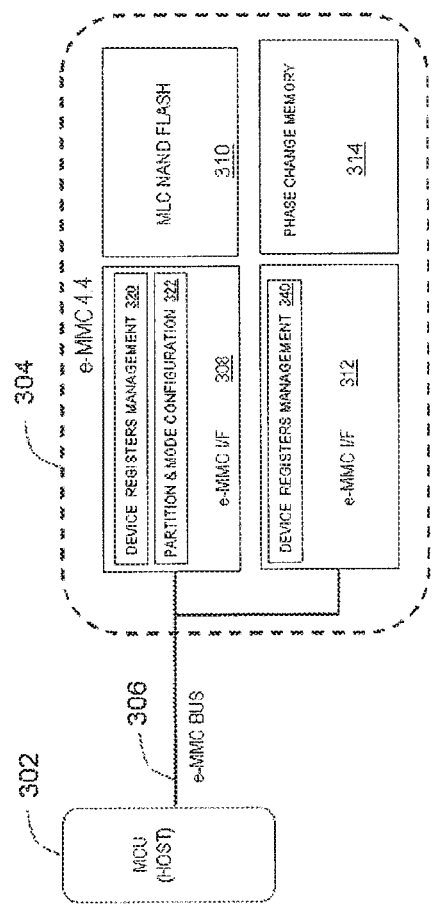
FIG. 3 illustrates an architecture having a bus common with two controllers, one for MLC NAND Flash and another for Phase-Change Memory (PCM) to provide memory partitioning.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

Current and future versions of embedded MultiMediaCard (MMC) standard specifications include partitioning features of the logical addressable space in a managed memory device. Partitioning the logical addressable space of nonvolatile memory permits the upper software layers which make use of the nonvolatile media to segment the available memory space to store different types of data or code. By further including Phase-Change Memory (PCM) as the nonvolatile memory in managed memory applications, features are provided that add quick adaptability to functionalities related to the device configurability by the host application in partitioning the addressable space.

FIGS. 1 and 2 illustrate an organization of the embedded MultiMediaCard addressable space, with FIG. 1 showing an organization 114 before partitioning and FIG. 2 showing an organization 214 after partitioning. Referring to FIG. 1, the embedded MultiMediaCard has an abstracted interface which allows the host to initially access a Boot Partition (BOOT 1) 102; a Boot Partition (BOOT 2) 104; a Replay Protected Memory Block partition (RPMB) 106; and a User Data Area 108. The two boot areas, i.e., Boot Partition 102 and Boot Partition 104, are used to store the system boot code that is downloaded at every power cycle using a standardized procedure. Replay Protected Memory Block Partition 106 is used to store the pieces of data and sensitive information that are protected by a security algorithm. User Data Area 108 is used to store data that may be accessed by MMC protocol commands.

At application level both Boot Partitions (BOOT1, BOOT2) 102, 104 and Replay Protected Memory Block partition (RPMB) 106, are required to be reliable. By including a Phase-Change Memory (PCM) in the embedded MultiMediaCard it is possible to map the Boot Partitions (BOOT1, BOOT2) 102,104 and Replay Protected Memory Block partition (RPMB) 106 to the Phase-Change Memory Array. This may be implemented as a default configuration, and in this case, the address space organization 114 before partitioning indicates this mapping.

FIG. 2 shows the available memory space of the reconfigured embedded MultiMediaCard. As shown by the figure and in accordance with features of the present invention, the memory may be configured during the lifecycle of the memory to obtain boot areas 202 and 204, i.e., Boot 1 and Boot 2, a Replay Protected Memory Block (RPMB) 206, a Main User Data Area 208, and up to four General Purpose partitions 212, 214, 216, and 218 having independent logical addressable space starting from address 0x00000000. A constraint placed on partitioning User Data Area 108 is that the size of the up to four General Purpose Partitions is a multiple of the Write Protects Groups.

It should be noted that the standard for the embedded MultiMediaCard specification, version 4.4, introduces a partitioning property that specifies general functional and nonfunctional characteristics. The standard stipulates that an 'attribute' be set in a dedicated register to give additional features on the partitions. With the 'attribute' set, User Data Area 208 may be partitioned to obtain an Enhanced User Data Area (EUDA) 210. However, the configurability is limited the standard to the number of general purpose partitions and the size of each partition.

The MultiMediaCard specification, version 4.4, introduces the possibility of having portions of memory with a different 'attribute' (enhanced) set. Configuring some of the partitions with the particular 'attribute' connotes that some of the addressable space may have different features in terms of performances or reliability, differentiating the available space to fit different usage models in the same device. Usage models may use the software layers, with access to the nonvolatile media, to partition the code and the application in separated memory areas.

Specifically, if the ENH_ATTRIBUTE_ENH bit in the Extended CSD Register (not shown) is set, then the device supports the attribute by default in Boot 202, 204 and RPMB 206 areas, whereas the host may configure the General Purpose Partitions or the sub-area EUDA 210 in the User Data Area 208 to support the same attribute.

In accordance with the present invention, by including a Phase-Change Memory (PCM) in the embedded MultiMediaCard it is possible to map the portions of memory with the 'attribute' enhanced set to the Phase-Change Memory Array, while mapping portions of the array without the 'attribute' enhanced set to NAND Array. Therefore General Purpose partitions 212, 214, 216, and 218 with the 'attribute' enhanced set and the EUDA are mapped to the Phase-Change Memory Array. In an alternative embodiment, General Purpose partitions 212, 214, 216, and 218 with the 'attribute' enhanced set are mapped to the Phase-Change Memory Array, while the EUDA is mapped to the NAND array configured as Enhanced.

FIG. 3 illustrates an architecture having an external Memory Controller Unit (MCU) 302 interconnected to a nonvolatile managed memory 304 through the e-MMC bus 306. This embodiment includes hybrid memory technologies of a Multi-Level Cell NAND Flash 310 and a Phase-Change Memory (PCM) storage 314. The e-MMC bus interface includes a clock signal (CLK) that synchronizes bus transfers; a command signal (CMD) that sends commands to the device on a bidirectional command channel and responses from the device back to the host; and bidirectional data signals (OAT [7:0]). The data signals may be configured for a single bit, 4-bits, or 8-bit data transfers.

With this shared bus architecture Memory Controller Unit (MCU) 302 uses e-MMC bus 306 to communicate with the two different nonvolatile memory technologies. The figure shows that e-MMC interface 308 is coupled to MLC NAND Flash 310 and e-MMC interface 312 is coupled to Phase-Change Memory (PCM) 114. Using this architecture MCU 302 may consider nonvolatile managed memory 304 as a 'black box'. In other words, e-MMC interface 308 and e-MMC interface 312 both share MMC bus 306 and the functionality embedded within the abstracted logical interface blocks hides the actual storage media used to retain data and information.

The memory combination that includes NAND Flash 310 fulfills requirements having reference to pure mass storage applications while the PCM storage 314 addresses read intensive applications such as, for example, "demand paging" for code storage and execution. The PCM characteristics allow increased performances in terms of random read access latencies and provide higher reliability.

It should be pointed out that the combination also differentiates the memory portions in which the attribute property may be set. In communicating using e-MMC bus 306, both e-MMC interface 308 and e-MMC interface 312 have well identified roles in their transactions with MCU 302. Briefly referring to FIG. 1, e-MMC interface 308 services all requests to access the User Data Area 208, the Enhanced User Data Area 210 and all the General Purpose Partitions whose 'attribute' parameter is not set.

Thus, when managed memory 304 receives a command, the rule that is followed is that the e-MMC interface 308 controller is 'aware' of the existence of the e-MMC interface 312 controller, but the opposite is not true, i.e., the e-MMC interface 312 controller is not aware of the e-MMC interface 308 controller. Again, e-MMC interface 308 is responsible for managing those commands and modes that involve an access to the Enhanced Areas, the User Data Area 208, and all those General Purpose Partitions whose attributes are not set.

E-MMC interface 308 controller includes a device registers management block 320 and e-MMC interface 312 includes a registers management block 340 to track the memory partitions which may be enabled in order to map the memory partitions. In general, registers management block 320 and registers management block 340 store information about nonvolatile managed memory 304, information about the functionalities supported in the device, and information used to configure the operating modes and the functionalities themselves. The two controllers also have the capability of disabling certain actions during the execution of commands.

A SWITCH command issued by MCU 306 modifies fields of the Extended CSD Register (not shown in the figure) to configure parameters of partitions. Only a partition size and an attribute of up to four General Purpose Partitions and an Enhanced User Data Sub Area may be chosen by the host. If the memory portion selected by the host to configure is not 'enhanced', then e-MMC interface 308 configures itself according to the request.

However, in accordance with the present invention that uses PCM as the nonvolatile memory in the embedded MultiMediaCard in a managed memory environment, reconfiguring the partitioning may be done during the device lifecycle since there is no degradation of the storage media due to the reconfiguration process. This has particular relevance for systems that re-organize the non-volatile memory area for bug fixing, software updates, etc.

When MCU 306 issues the SWITCH command, a register 322 inhibits a response in e-MMC interface 312 while e-MMC interface 308 is in charge of generating the response towards the host application. If the SWITCH command is sent to set up the General Purpose Partitions with the enhanced attribute selected or the Enhanced User Data Area, then the e-MMC interface 312 configures PCM 314 to contain these partitions. In an alternative embodiment this area may be derived from the e-MMC interface 308 whose MLC NAND Flash may be configured partially as an SLC device.

The SWITCH command may select a configured partition, and in this case, the e-MMC interface 308 is the owner of the response. If the selected partition is a 'default' partition, then e-MMC interface 308 configures itself to manage the incoming commands. On the other hand, if the host wants to select an 'enhanced' partition then e-MMC interface 312 configures itself. The e-MMC interface 308 remains in charge of replying to MCU 302 so it stores parameters related to the 'enhanced' partitions in order to manage possible error conditions. If the selected partition does not exist then e-MMC interface 308 generates an error in the response to the host.

Two conditions may be distinguished when accessing a partition derived in e-MMC interface 308 or a partition derived in e-MMC interface 312. In the first case, e-MMC interface 308 replies to MCU 302 and manages all of the embedded operations to service the command while e-MMC interface 312 is in the idle mode. In the second case, if the command refers to the e-MMC interface 312 then this interface replies to the host and manages the internal operations to service the command. In this situation where e-MMC interface 312 is in charge, the e-MMC interface 308 is in a power saving mode, i.e., a standby mode, in order to minimize power consumption and efficiently allow random accesses to the memory system.

If MCU 302 accesses Main User Data. Area 208 then e-MMC interface 308 executes the command while e-MMC interface 312 is inhibited from providing a reply. If MCU 302 issues a device register SET/GET command, the e-MMC interface 308 manages these commands while the e-MMC interface 312 does not provide a reply. If MCU 302 provides an initialization command sequence, then the e-MMC interface 308 becomes the owner of the command response. During the initialization phase, e-MMC interface 308 executes a series of operations to properly set up the device firmware for the NAND Data Management. However, both e-MMC interface 308 and e-MMC interface 312 execute the corresponding state transitions in order to be aligned and ready for the execution of the other incoming commands. For state transitions that are induced by the MCU 302 that involve the sleep state, the inactive state, etc., both devices execute the requested state transitions but only the e-MMC interface 308 replies to the host.

Figure 4:
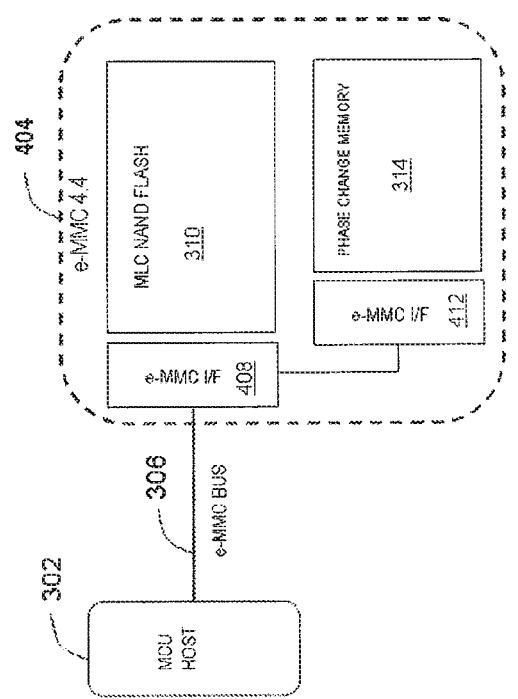
FIG. 4 illustrates an architecture that includes the host coupled via a bus to a controller that is connected to MLC NAND Flash, with the controller connecting to another controller for the PCM.

FIG. 4 illustrates an architecture that includes command-response transitions managed by the e-MMC interface 408 connected to MCU 302 through eMMC bus 306. The commands coming from the host side are visible to e-MMC interface 412 through a connection between e-MMC interface 408 and e-MMC interface 412. This connection allows commands and data to be received and data to be sent as requested by the host. E-MMC interface 412 manages the commands referencing the partitions set up in device 404.

In this architecture the memory organization allows e-MMC interface 412 to handle the two boot areas, i.e., boot 202, 204, and the RPMB area, i.e., RPWB 206 (see FIG. 2). The e-MMC interface 408 handles up to four General Purpose Partitions if the partition has the 'enhanced' attribute reset or e-MMC interface 412 handles the partitioning if the partition has the 'enhanced' attribute set. The User Data Area 208 is handled by e-MMC interface 408. The Enhanced User Data Area, i.e., EUDA 210, is handled by e-MMC interface 408 if it is implemented by a MLC NAND Flash 310 settable as SLC, otherwise it is handled by e-MMC interface 412.

Figure 5:
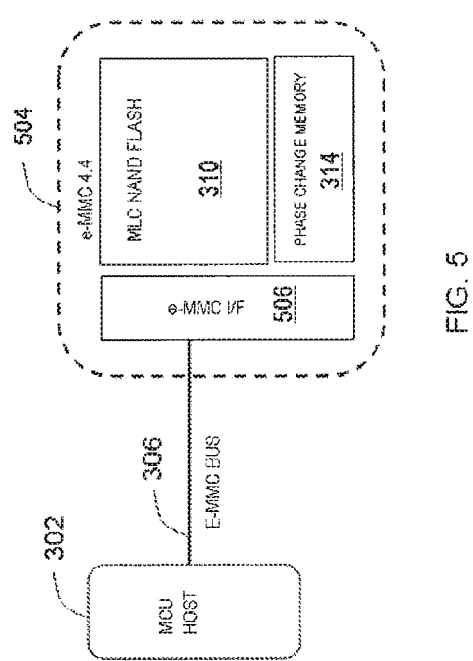
FIG. 5 illustrates an architecture that includes a bus coupling the host to one controller that is connected to both the MLC NAND Flash and the PCM.

FIG. 5 illustrates a multi-dice architecture having one e-MMC controller 506 responsible for communicating with the host MCU 302 using the MMC protocol and e-MMC bus 306. The e-MMC controller 506 communicates on the memory side with the differing memory technologies of MLC NAND Flash 310 and Phase Change Memory 314. The e-MMC controller 506 manages the logical memory partitioning and the enhanced default differentiation. For instance, the two boot areas and the RPMB area (boot 202, 204 and RPMB 206) are partitioned in the PCM STORAGE 314. Up to four General Purpose Partitions (GP 212, 214, 216, and 218) may be partitioned in MLC NAND Flash 310 if the partition has the 'enhanced' attribute set or in PCM STORAGE 314 if the partition has the 'enhanced' attribute reset. The User Data Area 208 may be partitioned in MLC NAND Flash 310. The Enhanced User Data Area (EUDA 210) may be partitioned in MLC NAND Flash 310 if it is implemented by a technology settable as SLC, otherwise, EUDA 210 is partitioned in PCM STORAGE 314.

By now it should be apparent that embodiments of the present invention allow increased memory storage efficiencies by using PCM in combination with NAND Flash. Since there are no dependencies on the underlying technology when PCM is used in a managed memory system, various architectures using controllers with different memory technologies can speed up the configuration timing. This flexible partition-management system can offer improved performance and endurance. The configurability provided to the PCM memory device allows different usage models and adaptive changes to the usage models themselves during the system lifecycle.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory device, comprising:
   first and second memory devices of different memory technologies, wherein the first memory device comprises non-volatile flash memory, and wherein the second memory device comprises phase change memory (PCM); and
   a first interface controller configured to be interposed between a memory bus and the first memory device, and a second interface controller configured to be interposed between the memory bus and the second memory device,
      the first interface controller configured to manage logical memory partitioning on at least the non-volatile flash memory,
   the first and second controllers further configured to allocate data of a first characteristic to the first memory device, and to allocate data of a second characteristic to the second memory device;
   the first interface controller configured to manage commands to mapped portions of the non-volatile flash memory without a selected attribute; and
   wherein the second interface controller is configured to reconfigure partitions of the PCM as directed by the external memory controller unit.

2. The memory device of claim 1, wherein the first interface controller is configured to be aware of the existence of the second interface controller, and the second interface controller is configured not to be aware of the first interface controller.

3. The memory device of claim 1, wherein the first interface controller and the second interface controller each include a register management block to track memory partitions.

4. The memory device of claim 1, wherein the first interface controller is configured to service all requests to access a user data area, an enhanced user data area, and all general-purpose partitions without the selected attribute.

5. The memory device of claim 1, wherein the first interface controller and the second interface controller each connect directly to the memory bus.

6. The memory device of claim 1, wherein the first interface controller connects directly to the memory bus, and wherein the second interface controller is connected to the first interface controller.

7. The memory device of claim 4, wherein the first interface controller includes a partition and mode configuration block to inhibit a response from the second interface controller, and to allow the first interface controller to generate a response across the memory bus to a memory controller unit host, the response to include error conditions related to the enhanced user data area.

8. The memory device of claim 1, wherein the memory device comprises an embedded multi-media card (e-MMC) device.

9. An embedded multi-media card (e-MMC) memory, comprising:
a non-volatile flash memory coupled to a first interface controller, the first interface controller to be coupled to an external memory controller unit; and
a Phase-Change Memory (PCM) coupled to a second interface controller, the second interface controller coupled to the first memory controller to manage commands referencing partitions set up in the e-MMC memory using a connection between the first interface controller and the second interface controller;
the first interface controller configured to manage commands to mapped portions of the non-volatile flash memory without a selected attribute;
the second interface controller configured to map the portions of the PCM with the selected attribute; and
the second interface controller is further configured to reconfigure partitions of the PCM as directed by the external memory controller unit.

10. The e-MMC memory of claim 9, wherein the non-volatile flash memory comprises NAND Flash memory.

11. The e-MMC memory of claim 10, wherein the non-volatile flash memory comprises a number of Multi-Level Cell (MLC) devices.

12. The e-MMC memory of claim 9, wherein:
the first interface controller is configured to be aware of the existence of the second interface controller; and
the second interface controller is configured not to be aware of the first controller.

13. The e-MMC memory of claim 9, wherein a combination of memory types including the non-volatile flash memory and the PCM allows the e-MMC memory to access the non-volatile flash memory for mass storage applications and access the PCM for address-intensive applications.

14. The e-MMC memory of claim 13, wherein the address-intensive applications include read intensive applications.

15. An embedded multi-media card (e-MMC) managed memory device, comprising:
a first interface controller and a second interface controller, the first interface controller configured to be coupled to an external memory controller unit host and to be aware of the existence of the second interface controller and the second interface controller configured not to be aware of the first interface controller,
the first interface controller further configured to provide all responses to incoming commands received from the external memory controller unit host;
a first type of non-volatile memory coupled to the first interface controller; and
a second type of non-volatile memory coupled to the second interface controller, the second interface controller configured to reconfigure partitions of the second type of non-volatile memory according to commands received from the external memory controller unit host.

16. The e-MMC managed memory device of claim 15, wherein:
the first type of non-volatile memory comprises Multi-Level Cell (MLC) NAND flash memory; and
the second type of non-volatile memory comprises Phase-Change Memory (PCM).

17. The eMMC managed memory device of claim 15, wherein, during a power management mode:
both the first interface controller and the second interface controller are configured to execute state transitions to an inactive state; and
only the first interface controller is configured to reply to the external memory controller unit host.

18. The eMMC managed memory device of claim 15; wherein:
the second interface controller comprises a register to inhibit a response in the second interface controller; and
the first interface controller is configured to manage generating the response to the external memory controller unit host.

19. The eMMC managed memory device of claim 15, wherein at least the first interface controller is to abstract the first type of non-volatile memory and the second type of non-volatile memory from the memory controller unit host, wherein the first interface controller connects directly to the memory bus, and wherein the second interface controller is connected to the first interface controller.

20. The memory device of claim 1, wherein the second interface controller is configured to map the portions of the PCM having the selected attribute.

21. The memory device of claim 1, wherein either of the first interface controller and the second interface controller may be in an idle state while the other interface controller services a command from a host.

* * * * *